「(12) United States Patent** (10) Patent No.: US 8,542,367 B2
Hug (45) Date of Patent: Sep. 24, 2013

(54) APPARATUS FOR ASSESSING A MOVING OBJECT

(75) Inventor: Karl Hug, Überlingen-Birkendorf (DE)

(73) Assignee: Mimot GmbH, Lörrach (DE)

( * ) Notice: Subject to any disclaimer, the term of this patent is extended or adjusted under 35 U.S.C. 154(b) by 244 days.

(21) Appl. No.: 13/065,834

(22) Filed: Mar. 30, 2011

(65) Prior Publication Data

US 2011/0242547 A1 Oct. 6, 2011

(51) Int. Cl.
*G01B 11/14* (2006.01)

(52) U.S. Cl.
USPC .......................................... 356/614

(58) Field of Classification Search
USPC ................. 356/614, 615, 622; 250/559.29, 250/559.32
See application file for complete search history.

(56) References Cited

U.S. PATENT DOCUMENTS

| 4,608,494 | A | * | 8/1986 | Kobayashi et al. ......... 250/461.1 |
| 5,369,493 | A | * | 11/1994 | Tomita et al. ................. 356/400 |
| 5,401,979 | A | * | 3/1995 | Kooijman et al. ....... 250/559.29 |
| 5,541,834 | A | * | 7/1996 | Tomigashi et al. ............. 700/59 |
| 5,878,484 | A | * | 3/1999 | Araya et al. .................... 29/740 |
| 6,359,646 | B1 | | 3/2002 | Kanauchi |
| 6,538,244 | B1 | * | 3/2003 | Skunes ...................... 250/208.1 |
| 6,781,775 | B2 | * | 8/2004 | Bendat et al. ................. 359/834 |
| 7,570,801 | B2 | * | 8/2009 | Horijon .......................... 382/151 |
| 7,602,491 | B2 | * | 10/2009 | Kandel et al. ................. 356/399 |
| 2005/0092402 | A1 | | 5/2005 | Walker |
| 2008/0083114 | A1 | | 4/2008 | Kim |
| 2008/0130130 | A1 | | 6/2008 | Horijon |

* cited by examiner

*Primary Examiner* — Roy M Punnoose
(74) *Attorney, Agent, or Firm* — Klaus J. Bach

(57) ABSTRACT

In an apparatus for assessing an object arranged on a movable carrier which includes an imaging arrangement for recording the object, the imaging arrangement is movable synchronously with the carrier.

2 Claims, 1 Drawing Sheet

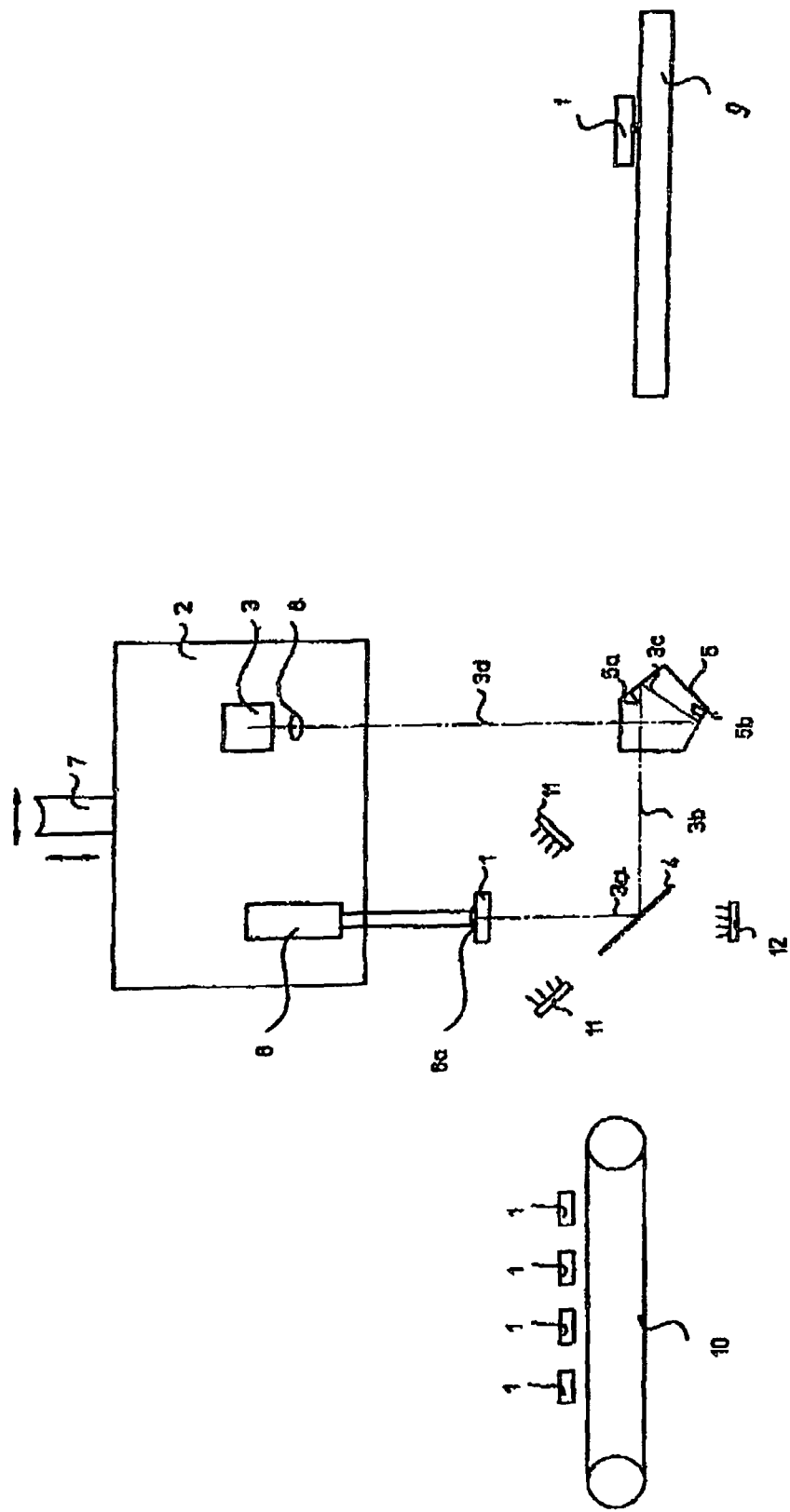

APPARATUS FOR ASSESSING A MOVING OBJECT

BACKGROUND OF THE INVENTION

The invention resides in an apparatus for assessing an object disposed on a movable carrier, which apparatus includes an image recording device for surveying the object.

Such an apparatus is well-known in the state of the art and is used among others for the determination of a location and/or position of work pieces or construction components in automatic assembly equipment and also in the application of electronic components to conductor plates.

In particular during the application of electronic circuit components to conductor plates, it is very important that the components are applied to the conductor plates in an accurate position. To this end, the position and location of a respective component relative to the gripper by which the component is applied to the conductor plate is determined.

By determining the position and the location of the building component in the gripper, the gripper can be so adjusted that the component is deposited on the conductor plate in an accurate position. The gripper is adjusted generally on the basis of coordinates determined by means of a camera which includes an image recording element in the form of a semiconductor chip and a lens. Based on the coordinates, by a comparison of the coordinates with the respective desired coordinates, the position adjustment required for the gripper can be calculated.

For determining the location and position of the building component in the gripper, the gripper, after taking on the building component from a storage arrangement, moves past a camera. The camera detects the location and the position of the component and supplies the respective coordinate values to a control unit which then evaluates the data. If the building component is not disposed exactly in its desired location and position on the gripper, correction values are calculated in the control unit by which the gripper deposits the building component on the conductor plate in a correspondingly displaced manner.

Even though electronic building components or, respectively, work pieces can be delivered by the gripper in an essentially accurate position and location, the accuracy of the apparatus can still be improved: Because the building components or respectively, workpieces move during their detection relative to the camera, depending on the exposure time, fuzzy edges of the building component or respectively, workpiece are recorded. This results in a position or location determination of the building component or work piece which varies in the area of the fuzziness. As a result, the correction values have a correspondingly limited accuracy.

It is the object of the present invention to provide an arrangement of the type as described in the introductory part in such a way that an exact determination of the position, or respectively, location of an object can be achieved even with long exposure time.

SUMMARY OF THE INVENTION

In an apparatus for assessing an object arranged on a movable carrier which includes an imaging arrangement for recording the object, the imaging arrangement is movable synchronously with the carrier.

Since the imaging arrangement is movable in synchronism with the carrier, the edges of the object are depicted in an advantageous and simple manner sharply defined and no longer fuzzy. Even with a relatively long exposure time which is advantageous for the sharpness of the image of the object and a relatively high moving speed of the object, the object is depicted on the imaging arrangement in a sharply defined manner.

Preferably, the imaging arrangement is arranged on the carrier. In this way, an accurate synchronization of the movement of the imaging arrangement and the movement of the object is achieved in a simple manner.

In a particularly advantageous embodiment of the invention, the beam path of the imaging arrangement includes at least one mirror. In this way, the apparatus can be of very compact design since, then, the imaging arrangement may be arranged next to a gripper which is arranged on the adjustable carrier and which holds the object. Since in this case, the camera does not need to be arranged below the gripper the apparatus design is further simplified.

However, this embodiment has the disadvantage that the beam path of the imaging arrangement includes a branch beginning below the gripper and extending at an angle upwardly toward the imaging arrangement. Since the beam path must not be interrupted, a correspondingly large area of the arrangement must be kept free from machine elements. As a result, the design is relatively expensive.

In a further embodiment of the invention, the beam path of the imaging arrangement has an uneven number, but at least three, mirrors. Then the beam path can be so selected that it extends below the gripper and below the imaging arrangement in a vertical direction and has a branch extending horizontally at a particular distance from the gripper or, respectively, the imaging arrangement. Since the beam path no longer has a branch that extends at an angle, the respective space can be used for accommodating machine elements providing for a simplified design of the arrangement.

Preferably, the beam path includes at least one pentaprism. This further simplifies the design of the arrangement.

The invention will become more readily apparent from the following description of a particular embodiment thereof with reference to the accompanying drawings.

BRIEF DESCRIPTION OF THE DRAWINGS

The sole FIGURE is a schematic representation of an arrangement according to the invention.

DESCRIPTION OF A PARTICULAR EMBODIMENT

As shown in the FIGURE, a gripper 6 and an imaging arrangement including a camera 3 with a lens 8 are arranged on a carrier which is in the form of a mounting plate 2. The mounting plate 2 is mounted on an arm 7 of a handling system which is not shown in the FIGURE. By means of the handling system, the mounting plate 2 is adjustable in vertical as well as horizontal directions. Instead of the mounting plate 2 being adjustable in a vertical direction, the gripper may be vertically adjustable. In this way, the cameras position in vertical direction can be maintained.

The gripper 6 is provided with a vacuum suction device 6a by which an object in the form of an electronic building component 1 can be engaged by the gripper 6.

The electronic building component 1 is picked up by the gripper 6 from a storage device in the form of a conveyor belt 10 and is placed onto a conductor plate 9.

Since the position and the location of the building components 1 on the conveyor belt 10 may vary, the building components 1 are arranged on the gripper in correspondingly different positions and locations. For depositing the building components 1 in each case in an accurate position and location on the conductor plate 9, the position and location of the building component J. arranged on the vacuum suction device 6a is detected. To this end, a first mirror 4 is arranged below the gripper 6 which redirects the light beam reflected from the building component 1 by 90°, only the main beam 3a being shown in the figure. The light reflected from the building component 1 is generated by light sources 11 which are arranged on the side of the first mirror 4 and below the building component 1. Furthermore, the light may be generated by a light source 12 which is arranged below the first mirror 4. In this case, the first mirror 4, of course, needs to be light transparent or semi-light transparent.

The redirected light beam 3b then reaches the mirrored surface 5a of one side of the pentaprism 5 which again redirects the light beam 3b. The again redirected light beam 3c impinges within the pentaprism 5 on a further mirror surface 5b of the pentaprism 5 where it is again redirected. The again redirected light beam then extends again vertically and reaches the lens 8 of the camera 3. The coordinates of the image of the building component 1 recorded by the camera 3 are transmitted to a control unit which is not shown in the FIGURE but in which the coordinates are compared with desired values. Based on the deviation of the detected coordinates from the desired values correction values are calculated which are then supplied to the handling system which is also not shown in the FIGURE and by which the building element 1 is deposited on the conductor plate 9 accurately positioned and located.

Since the camera 3 and the gripper 6 are position-fixed relative to each other when passing by the optical arrangement consisting of the first mirror 4 and the pentaprism 5, the building component 1 is depicted on the imaging arrangement of the camera 3 as a stationary object. As a result, the edges of the building component are not blurred.

Because the beam path 3a, 3b, 3c, 3d of the camera is redirected three times, the vertical branches 3a, 3d of the beam path are all subjected to the same horizontal displacement when the carrier 2 and, together therewith, the gripper 6 as well as the building component 1 pass by the optical arrangement consisting of the first mirror 4 and the pentaprism 5 which are fixed.

What is claimed is:

1. Apparatus for assessing a moving object (1) disposed on a movable mounting member (2) comprising: an imaging arrangement with a camera (3) for recording the object (1), the camera (3) being mounted on the movable mounting member (2) so as to be position-adjustable together with the movable mounting member (2), the imaging arrangement including a beam path (3a, 3b, 3c, 3d) from the object (1) to the camera (3) with an uneven number of stationary minors but at least three mirrors (4, 5a, 5b) arranged in the beam path (3a, 3b, 3c, 3d) between the object (1) and the camera (3) outside the movable mounting member (2).

2. Apparatus according to claim 1, wherein the beam path (3a, 3b, 3c, 3d) includes at least one pentaprism (5).

* * * * *